SUPERCONDUCTIVE SEMICONDUCTOR DEVICES

Filed Dec. 22, 1967 2 Sheets-Sheet 1

INVENTORS
JOE T. PIERCE
WALTER H. SCHROEN
BY
Robert [signature]
ATTORNEY

May 12, 1970 J. T. PIERCE ET AL 3,512,017

SUPERCONDUCTIVE SEMICONDUCTOR DEVICES

Filed Dec. 22, 1967 2 Sheets-Sheet 2

United States Patent Office
3,512,017
Patented May 12, 1970

3,512,017
SUPERCONDUCTIVE SEMICONDUCTOR DEVICES
Joe T. Pierce, Richardson, and Walter H. Schroen, Dallas, Tex., assignors to Texas Instruments Incorporated, Dallas, Tex., a corporation of Delaware
Filed Dec. 22, 1967, Ser. No. 692,907
Int. Cl. H03k 3/38
U.S. Cl. 307—306 7 Claims

ABSTRACT OF THE DISCLOSURE

Disclosed is a cryogenic switching device comprising superconductive semiconductor material containing regions of different conductivity.

This invention relates to cryogenic electronic devices, and more particularly to superconductive thin film switches using semiconductor material.

For purposes of this application, a material which has the capability of exhibiting superconductivity is referred to as superconductive. When a supercurrent is flowing in such a material, the material is said to be superconducting.

The cryotron is basically a switch whose conducting state may be influenced by the control of ambient magnetic field levels, either self-induced or externally provided by current in an adjoining conductor. As is known, a superconductive metal, preferably in the form of a thin film, forms a resistive switch or cryotron within a circuit when the material is returned to the normal conductive state. In accordance with this invention, a considerably enhanced switching effect is obtained by the use of semiconductor material, and particularly semiconductor material containing a junction, preferably in thin film form, utilizing the transition from the superconductive to the normal semiconductive state and vice versa.

Therefore, the following are among the objects of the invention:

To use a superconductive semiconductor material as a switch or cryotron;

To provide a device fabricated from superconductive semiconductor material having regions of different carrier concentration forming a junction;

To provide a device fabricated from semiconductor material having regions of different conductivity types forming a P-N junction;

To provide a switching device using a control current in a control lead located near the junction in the semiconductor material but separated from it by an insulating layer;

To provide a cryotron having markedly increased switching speed;

To provide a cryotron having an enhanced output signal; and

To provide a cryotron which reduces the requirements for the amplifier of the room temperature logic operation with respect to gain and noise level.

Referring now to the drawings.

Figures 1, 2:
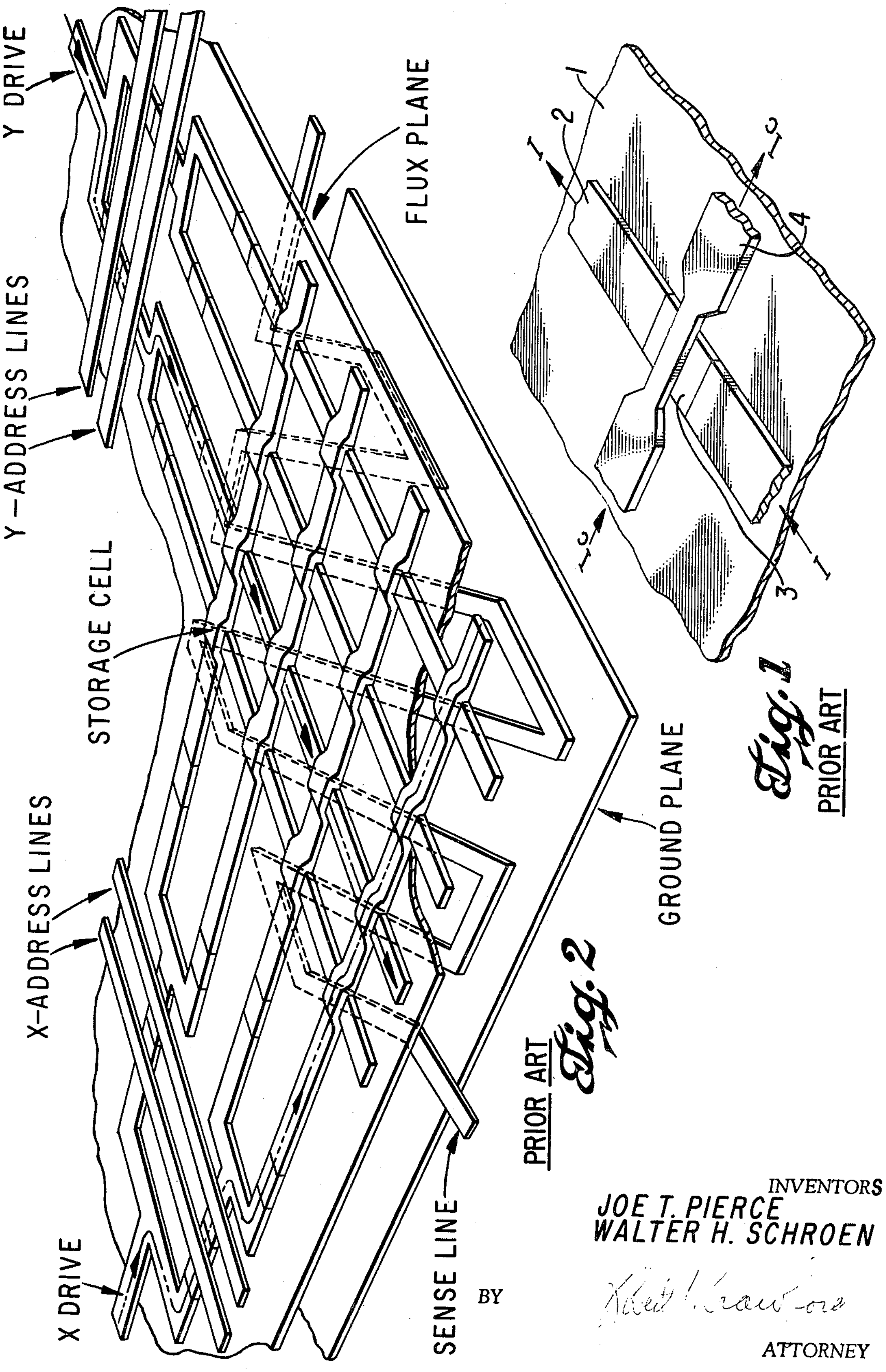
Fig. 1 PRIOR ART, Fig. 2 PRIOR ART
FIG. 1 depicts a simple prior art cryotron of the crossed film type.
FIG. 2 illustrates a prior art continuous-sheet superconductive memory of a simple type.

The device of the invention is operated at a temperature below the transition temperature of the superconductive material used. Accordingly, in order for the device to operate it generally must be contained in a cryogenic refrigerator of some kind. However, since this type of apparatus is well known in the art, it has not been illustrated, and in the following detailed description of the operation of the device of the invention, it is assumed that the device is in such a low temperature environment that superconductivity is possible.

One of the most outstanding properties of a superconductor is the abrupt disappearance of electrical resistivity at a critical temperature $T_c$ near absolute zero, which is characteristic of the superconductor. Another fundamental property of a superconductive material is that its ordinary, or normal, resistance may be restored upon the application thereto of a magnetic field greater than the critical value $H_c$. This critical field depends upon the material and its temperature. Superconductivity can also be destroyed by passing sufficient electric current through the superconductor, in which case the transition to normal resistivity is effected by the magnetic field at the surface of the superconductor produced by the current.

In the case of superconductive materials designated type I or "soft," if the magnetic field is raised to a level equal to or greater than $H_c$, the superconductor is converted to the normal state and the field immediately penetrates the material. Certain other materials, however, remain superconductive even while partially penetrated by the magnetic field. These materials are referred to as type II or "hard" superconductors. For purposes of this application, the significance which attaches to this distinction is that "hard" or type II superconductors require a greater magnetic field to switch them to the normal state.

Yet another facet of the behavior of superconductors of type I is that a magnetic field of less than $H_c$ applied around such a superconductor at a temperature below $T_c$ will not penetrate the superconductor. Also, if the field is first applied above temperature $T_c$ and the superconductor is then cooled below this temperature, the field is expelled from the sample as soon as it becomes superconducting. This expulsion of the magnetic field is commonly referred to as the Meissner effect. Accordingly, the change from the superconductive to the normal state, or vice versa, by the application or removal of a field equal to or greater than $H_c$ is a reversible process.

The above described phenomena are utilized in the operation of cryoelectric memories. Typically, the temperature of the device is held at a constant temperature below $T_c$ by refrigeration. A current is applied through a superconductive control line which generates a magnetic field that switches a second superconductor in close proximity to the control line. This principle may be better understood by reference to FIG. 1 which depicts a simple crossed-film cryotron of the prior art which comprises an insulating substrate 1 such as glass, a line 2 of a first superconductive material such as lead on the substrate, having a gate 3 of a second superconductive material, such as tin. Separated from the line 2 by a suitable insulation (not shown) and traversing the gate 3 is the control or switching line 4 made of the first superconductive material, that is to say, lead in the present example.

Assuming the entire device to be held below the critical temperature and magnetic field, current I from an appropriate source (not shown) flows through the superconductive line 2 having the region of the second material, for example tin. The control current $I_c$ is directed through the control or switching line 4. Since the first material (lead) in the superconductive line 2 has a much higher transition field than the second material (tin), a small current through the control line 4 can produce a sufficient field to make the gate 3 (the second region) become normal without destroying the superconductivity of the control line. The change in the resistance of gate 3 from zero to the finite normal value is equivalent to breaking the gate circuit. Thus a large current through the gate 3 may be controlled by a small one through the control line.

Figures 3, 4, 5, 6:
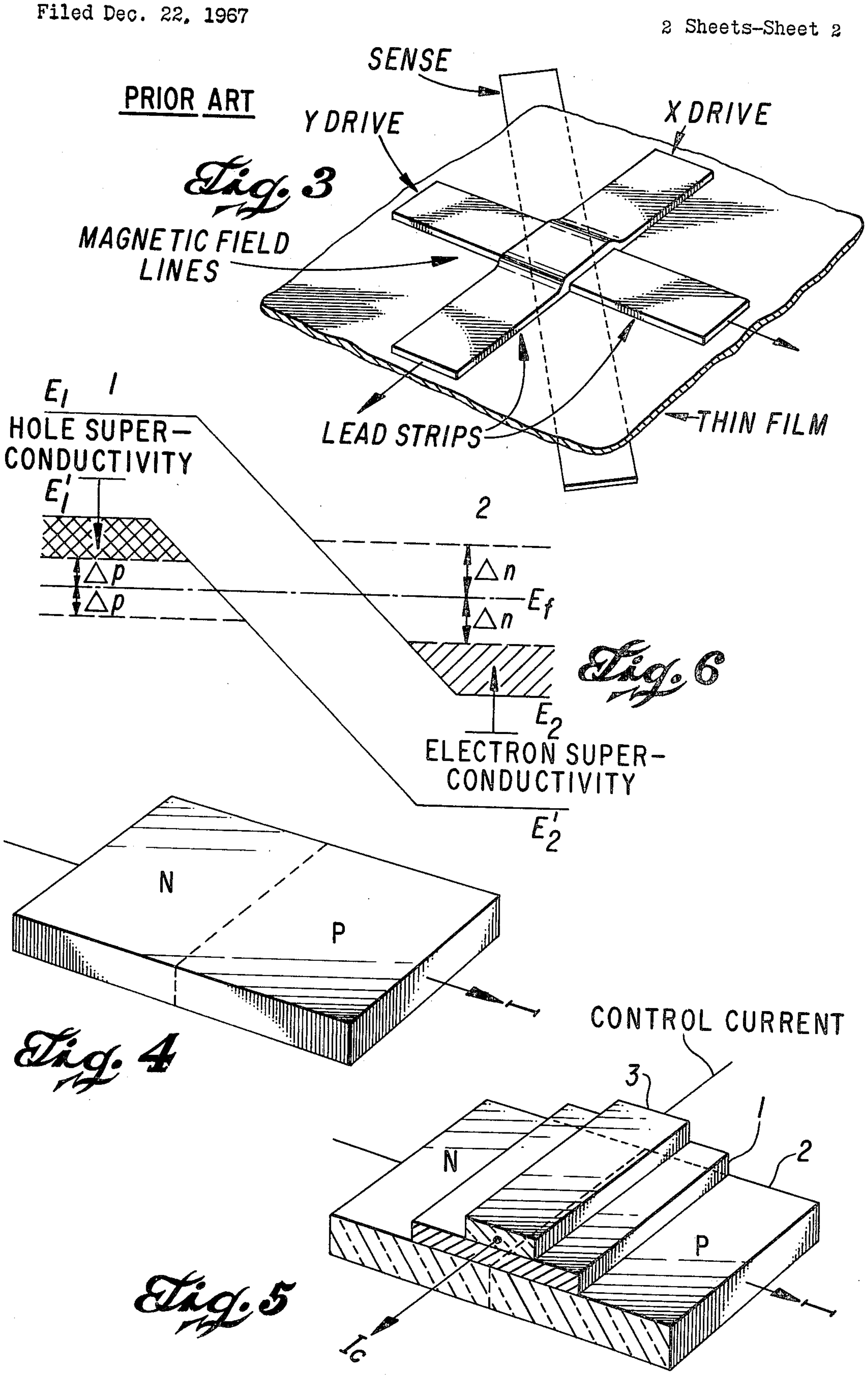
FIG. 3 shows a single memory cell from the device of FIG. 2.
FIG. 4 depicts one configuration of the switching diode of the invention.
FIG. 5 illustrates another specific embodiment of the invention wherein switching is accomplished by a control current.
FIG. 6 is a schematic representation of a degenerate P-N junction in a superconductive semiconductor.

To illustrate the operation of cryotrons, consider the simple continuous sheet superconductive memory arrangement of the prior art shown in FIG. 2 and the structure of a single memory cell thereof shown in FIG. 3. In FIG. 2, there are two orthogonal grids of lead (Pb) $x$ and $y$ drive lines located above and insulated from a thin superconductive tin sheet which serves as a flux plane. The selection of a single element in this array is made by sending current pulses in one of the $x$ drive lines and one of the $y$ drive lines simultaneously, there being an $x$ address (control) line over and across each gate (tin) region in the $x$ orthogonal grid of which only two such control lines are shown in the drawing, and a $y$ address (control) line over and across each gate (tin) region in the $y$ orthogonal grid, of which only two such control lines are shown for the latter grid. The current level in one drive line is not sufficient to cause flux switching in the flux plane. However, when the combined field of the $x$ and $y$ pulses is higher than the critical field, switching is effected at the appropriate $x$–$y$ intersection. A zigzag sense line links all the memory cells, and the appearance of a sense signal at its terminals indicates that switching has occurred at the addressed location.

The selection of the appropriate $x$ and $y$ lines for any addressed locater ($x$–$y$ intersection) is made by passing a current through each of the address lines in each of the grids $x$ and $y$ that lie over gate regions whose state of conductivity is to be changed from superconductive to normal resistivity, thus causing the current applied to the apex of each of the grids to flow through the one address line therein which remains superconductive. Each binary combination of the address line currents corresponds to a superconductive path chosen to carry the drive current to the selected memory location. For clarity of illustration (and as previously stated), only one pair each of $x$ and $y$ address lines is shown in FIG. 2.

FIG. 3 is a sketch of a single continuous film memory cell showing the $x$- and $y$-drive lines superimposed over the tin memory or storage plane; underneath is a sense line. All of these individual lines are insulated from one another and from the sense plane. The coincidence of the drive currents through the $x$- and $y$-drive lines at the intersection of the drive strips produces magnetic fields which add vectorially to a magnitude sufficient to switch the region of storage plane beneath the intersection. The region beneath the intersection of the drive strips returns to the superconducting state as the drive pulse decays, causing the flux linking the intersection to be "trapped" in the storage plane. Upon removal of the drive currents, persistent currents are established which support this flux. If subsequent drive currents are polarized so as to have their magnetic fields vectorially add to that of the persistent currents stored in the tin film, the magnitude of the resultant field near the intersection where the drive currents are coincident, will be sufficient to cause the region of storage plane beneath the intersection to switch to the normal state, and a voltage pulse on the order of microvolts will appear across the sense line. If the drive currents are polarized so as to have a magnetic field that vectorially subtracts from that of the stored current, the net field acting at the region of film beneah the intersection will be of a magnitude insufficient to cause the switching of this region and no voltage pulse will be induced in the sense line.

Of importance to the operation of a continuous film memory of the type shown in FIG. 3 is the shielding property of tin storage plane itself. No flux penetrates through the plane to link the sense line unless the plane is switched by the drive currents. This exclusion of the flux is the Meissner effect and makes possible the operation of the continuous film memory cell. In FIG. 2 a ground plane (generally of lead) is shown, which shields the entire memory network from stray magnetic fields. For more detailed information regarding cryogenic memory arrays see the October 1964 Proceedings of the IEEE, devoted to "Cryogenic Electronics."

It is apparent from the foregoing discussion that the rapidity with which a particular memory location can be addressed is dependent upon the switching speed of the cryogenic switches in the $x$ and $y$ drive line networks. In accordance with this invention, the switching speed of cryogenic switches is greatly increased by the use of semiconductor material, in particular by the use of semiconductor material containing a junction.

One embodiment of the invention consists essentially of a simple junction in a semiconductor which can be switched to the superconducting state and vice versa. Such a switching device is shown in FIG. 4. It is basically a diode-like structure consisting of n-type and p-type material separated by the junction. When such a diode device is in the superconducting state it conducts without resistance. It can be switched to the normal semiconductor state either by passing a current at least as large as the critical current which forms a magnetic field of sufficient strength to destroy superconductivity, or by an externally induced magnetic field.

An example of a second embodiment is shown in FIG. 5. An insulating layer 1 is deposited on top of the semiconductor 2 in order to separate the control current $I_c$ in the superconductive metallic strip 3 from the diode structure. The magnitude of the critical current (or the control current) depends on the semiconductive material to be switched from the superconductive to the normal state. When the material is of the hard or type II category superconductor, a considerably higher current will be needed to accomplish the switching than when a soft or type I superconductor is used.

In a preferred embodiment of the invention, lead telluride (PbTe) is employed as the semiconductor material. Lead telluride is particularly advantageous because it becomes superconductive at about 5° K. Since the boiling point of liquid helium is 4.2° K., maintenance of the temperature below $T_c$ for PbTe is no problem. Thallium is an appropriate P-type dopant for PbTe. Aluminum, gallium, titanium, tantalum, zinc, manganese, or bismuth is a suitable N-type dopant for PbTe.

Other preferred materials include lead sulfide (PbS) and lead selenide (PbSe), ternary salts such as $$Pb_xSn_{x-1}Te$$

where $x$ varies from greater than zero to one, and mixtures of lead salts, e.g., mixtures of lead telluride (PbTe) and lead selenide (PbSe).

A junction formed in a superconductive semiconductor carries a supercurrent in a manner analogous to a tunnel current in a tunnel diode. As in the usual tunnel diode, the current J through such a junction as shown in the energy level diagram of FIG. 6, wherein $E_f$ is the Fermi level; $2\Delta p$, $2\Delta n$ are the energy gaps in the superconductors 1 and 2; $E_1$, $E_2$ represent the bottom of the conduction bands and $E'_1$ and $E'_2$ represent the bottom of the forbidden band of the semiconductor, and can be written in the form:

$$J \sim \int [K_{12}N_2(E+V)f_n(E+V)N_1(e)\, f_p(E) - K_{12}U_1(E)\, f_n(E)N_2(E+V)f_p(E+V)]dE$$

where $K_{12}$ and $K_{21}$ are the tunneling coefficients, $N_1$ and $N_2$ are the superconducting densities of states in regions 1 and 2, $f_n(E)$, $f_p(E)$ are the distribution functions of electrons and holes, and V is the additional energy supplied by the applied field. FIG. 6 shows the energy level of the p–n junction at $V=0$. Both sides of the junction consist of degenerate material because of the high carrier concentration necessary to make the semiconductor material superconductive. See Vul, B. M. and Selivanenko, A. S., "Superconductivity in Semiconductors," Soviet Physics Solid State, vol. 7, page 1510 (1965).

It is well known in the semiconductor art that any junction establishes a potential step that is sufficient to retard the free diffusion of carriers. The junction will increase the resistance encountered by the current, particularly when it flows in the blocking direction of the junction, when the semiconductive material is switched to the normal state from the superconductive state. Similarly, an increase in resistance, although less marked, will be observed if there is a gradient in the doping level of the semiconductor, e.g. $n$ to $n+$.

Techniques for the formation of a junction in the wafer structure or in a thin film structure upon an inert substrate are well known in the art. See for example, Schoolar, R. B. and Zemel, N. J., "Preparation of Single-Crystal Films of PbS," Journal of Applied Physics, vol. 35, page 1848( 1954).

Since the resistance of the diode in the superconducting state is zero and the barrier resistance in the normal state is on the order of ohms or kilo-ohms, the difference in the resistance is enormous. The device, therefore, will be of value wherever it is desired to have the resistance in the normal state very great compared to that in the superconducting state. In accordance with the present invention, the metal gates depicted in FIG. 2 are replaced with semiconductor material containing a p-n junction. While there is no resistance and thus no voltage drop across the junction when the semiconductor is in the superconducting state, a considerable barrier resistance and thus voltage drop, will appear when the gate is switched to the normal state. This voltage drop across the gate is directed to an amplifying circuit for monitoring voltage pulses or other information. In contrast, when the layer exhibiting the junction is made of a metallic material used in current cryotron technology, the voltage drop appearing across the geometrical distance of the strip is limited to a few microvolts.

In present applications, the advantages of cryoelectronic devices are partially offset by the limited sensitivity of existing room temperature amplifiers. It is not possible to make the metallic gate film very thick to enable large currents to be carried which would produce a large signal. If this were done, the $L/R$ time constant of the cryotron would be changed, resulting in the reduction of the operating speed and cycle time of the memory. In accordance with this invention, however, not only are larger signals produced, thus simplifying the amplification problem, but the resistance of the cryotron loop is made great, thus resulting in an increase in the switching speed.

If the gate is made of superconductive semiconductor material having a junction therein as described above, the voltage drop across the junction may be in the range of millivolts or volts when the layer is switched to the normal state. Such a high voltage output reduces the need for subsequent amplification. It has the effect of preamplifying the information pulse at cryogenic temperatures. This signal enhancement at cryogenic temperatures in turn simplifies the costly and complicated amplification requirements for the room temperature elements of the cryogenic associative processor or logic operation.

The enhancement of the output signal from the present microvolt level to the millivolt or volt level will result in considerable simplification of the sense or signal amplifier. While a high gain amplifier is needed in the present state of the art, in accordance with this invention a lower gain amplifier is sufficient. Also, the low noise level presently required will no longer be necessary. Accordingly, the logic operation at room temperature is considerably simplified.

There are at least three time constants which determine the overall switching speed of a cryotron, namely, the superconducting-to-normal state transition time $\tau_t$, the loop current transfer time $\tau_L$, and the thermal energy dissipation time $\tau_\theta$.

$\tau_t$ is associated with the switching process which introduces resistance into the gate. This transition of the gate from the superconducting to the normal state (or vice versa) is not instantaneous, since the propagation of the normal superconducting phase boundary from the two parallel surfaces into the film is retarded by eddy-current damping in the normal material. According to A. B. Pippard, "Kinetics of Phase Transition in Superconductors," Philosophical Magazine, vol. 41, page 243 (1950), $\tau_t$ is given by the expression $$\tau_t = \frac{\mu_o d^2}{8\rho} \frac{I_{co}}{I_c - I_{co}} \quad (1)$$

where $\mu_o$=free space permittivity, $d$=gate film thickness, $\rho$=gate resistivity, $I_{co}$=critical control current, $I_c$=applied control current. The ratio $(I_c - I_{co})/I_{co}$ is called the overdrive.

To take into account the temperature dependence of $I_{co}$, expression (1) has to be modified so that $I_{co} = I_{co}T$, where T is the absolute temperature. This temperature dependence is associated with the latent heat inherent in the first-order phase transition of the gate. For the transition from superconducting to normal state, the temperature of the gate is lowered, reducing the overdrive available for switching, and thus increasing $\tau_t$ (about two orders of magnitude compared to the isothermal case). The problem is aggravated when the nucleation of the phase transition does not occur uniformly over the gate surface, so that the phase transition also has to propagate across the film surface.

It is obvious from Equation 1 that $\tau_t$ can be reduced by increasing the gate resistivity. In addition, this method also shortens the transition time of the before-mentioned phase transition time across the film surface. So far, only alloy cryotrons (e.g. tin-doped indium in-line samples) of a resistivity up to about 1$\mu$ ohm-cm could be employed which are hampered by the fact that the gate's superconducting properties may suffer unduly. In the present invention, the desired reduction of $\tau_t$ is accomplished by the use of a superconductive semiconductor as gate material wherein $\rho$ will be about 1 order of magnitude larger than in metallic gates.

$\tau_L$ is associated with the transferring of the drive current from one branch of the cryotron loop to the other. In the first approximation, $$\tau_L = L/R_g \quad (2)$$

where L=total loop inductance, $R_g$=gate resistance. Thus, the switching delay in a cryotron loop is directly proportional to the inductance L and inversely proportional to the resistance. Since the inductance L is determined by the geometrical loop proportions, and may be considered constant for this purpose, any change of the resistance R is of particular importance.

Since $$R_g \sim W_c W_g$$

where $W_c$=width of the control film, $W_g$=width of the gate film.

One way to lower $\tau_L$ is to increase $W_c/W_g$ by reducing the width of the gate film. This approach, however, produces an adverse effect in crossed-film cryotrons, since it is essential that the value of the factor $W_c/W_g$ be small in order to provide a large overdrive. The overdrive, which is essential for a small $\tau_t$ [see Expression 1], is proportional to the geometrical gain factor $W_g/W_c$.

A solution to this dilema is provided in accordance with this invention by increasing the resistance through increasing the gate resistivity. The use of a superconductive semiconductor material provides this higher gate resistivity and thus keeps $\tau_L$ small [Expression 2] while $W_c$ can be kept small, thus allowing a large overdrive and a small $\tau_t$.

For a metal layer such as tin, the resistivity is on the order of $10^{-7}$ ohm-cm. For a semiconductor layer such as lead telluride, the resistivity is on the order of $10^{-6}$ ohm-cm., which represents an improvement of a factor of ten. Therefore, the switching speed of a cryotron loop can be enhanced considerably by using semiconductor materiad. It can be further increased by inserting in the layer the junction structure described above.

$\tau_\theta$ is associated with the thermal energy dissipated in the normal cryotron gate during the transfer of the drive current. This energy increases the gate temperature above that of the helium bath, following which the gate cools toward the bath temperature with the thermal time constant $\tau_\theta$ given by $$\tau_\theta = C_v S d^2 / K \qquad (3)$$

where $C_v$=specific heat of gate material, S=density of gate material, $d$=gate film thickness, and K=thermal conductance of the gate to the substrate. $\tau_\theta$ can be reduced by use of the superconductive semiconductors made use of in this invention. This material allows a reduction of $d$ without adversely affecting the resistance $R_g$ needed for keeping $\tau_L$ small [Expression 2]. In addition, S will be somewhat larger in the case of lead salts, as compared to tin.

Thus, it has been demonstrated that the use of superconductive semiconductors shortens all three time constants, $\tau_t$, $\tau_L$ and $\tau_\theta$. It may readily be seen that this reduction of the switching time constitutes an important advantage of the present invention.

What is claimed is:

1. In a cryogenic array including means for maintaining the superconductive material therein below the critical temperature for said material, and a magnetic switching means for switching said superconductive material between superconducting and non-superconducting states, a cryogenic switching device comprising superconductive semiconductor material containing a P-N junction.

2. The device according to claim 1 wherein said superconductive emiconductor material contains at least one uniformly doped region.

3. The device according to claim 1 wherein said material is a lead salt.

4. The device according to claim 1 wherein said material is lead telluride (PbTe).

5. The device according to claim 1 wherein said material is a mixture of lead salts.

6. The device according to claim 1 wherein said material is a mixture of lead telluride (PbTe) and lead selenide (PbSe).

7. The device according to claim 1 wherein said material is a ternary salt to the form $Pb_xSe_{x-1}$ Te where $x$ varies from greater than zero to one.

References Cited

UNITED STATES PATENTS

| | | | |
|---|---|---|---|
| 2,979,668 | 4/1961 | Dunlap | 307—307 |
| 3,358,158 | 12/1967 | Tiemann | 317—234 |

JERRY D. CRAIG, Primary Examiner

U.S. Cl. X.R.

307—245; 317—234; 340—173.1